United States Patent
Mathuria et al.

(10) Patent No.: US 9,570,158 B1
(45) Date of Patent: Feb. 14, 2017

(54) OUTPUT LATCH FOR ACCELERATED MEMORY ACCESS

(71) Applicant: QUALCOMM Incorporated, San Diego, CA (US)

(72) Inventors: Priyankar Mathuria, Bangalore (IN); Gururaj Shamanna, Bangalore (IN); VRC Krishna Teja Kunisetty, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/146,070

(22) Filed: May 4, 2016

(51) Int. Cl.
*G11C 7/10* (2006.01)
*G11C 11/419* (2006.01)
*H03K 3/356* (2006.01)
*H03K 3/037* (2006.01)

(52) U.S. Cl.
CPC ............ *G11C 11/419* (2013.01); *G11C 7/106* (2013.01); *G11C 7/1051* (2013.01); *H03K 3/037* (2013.01); *H03K 3/356104* (2013.01)

(58) Field of Classification Search
CPC .............................. G11C 7/106; G11C 7/1051
USPC ..................................................... 365/189.05
See application file for complete search history.

(56) References Cited

U.S. PATENT DOCUMENTS

| 5,396,108 A * | 3/1995 | McClure .......... H03K 19/09429 327/208 |
| 6,118,714 A | 9/2000 | Ienaga |
| 6,996,013 B2 | 2/2006 | Itaka |
| 8,693,264 B2 | 4/2014 | Chand |
| 8,760,953 B2 * | 6/2014 | Chen ..................... G11C 7/065 365/207 |

* cited by examiner

*Primary Examiner* — Son Mai
(74) *Attorney, Agent, or Firm* — Haynes and Boone, LLP

(57) ABSTRACT

An integrated circuit (IC) is disclosed herein for accelerating memory access with an output latch. In an example aspect, the output latch includes a data storage unit, first circuitry, and second circuitry. The data storage unit includes a first input node configured to receive a first input voltage, a second input node configured to receive a second input voltage, a first output node configured to provide a first output voltage, and a second output node configured to provide a second output voltage. The first circuitry is configured to accelerate a voltage level transition of the first output voltage at the first output node responsive to the first input voltage at the first input node. The second circuitry is configured to accelerate a voltage level transition of the second output voltage at the second output node responsive to the second input voltage at the second input node.

30 Claims, 9 Drawing Sheets

OUTPUT LATCH FOR ACCELERATED MEMORY ACCESS

TECHNICAL FIELD

This disclosure relates generally to output latches for memory and, more specifically, to enabling output latches to accelerate read accesses of memory elements.

BACKGROUND

Modern electronic devices come in many forms. Personal modern electronic devices include smart watches, mobile phones, and notebook computers. Modern electronic devices deployed by corporations include server machines that power large data centers and cloud computing services, plus computing technology that is embedded in other devices, such as vehicles and manufacturing equipment. Further, internet-of-things (IoT) devices are modern electronic devices that employ processing capabilities to improve device interconnectedness. These IoT devices, which are proliferating in many areas of life, include thermostats, refrigerators, portable medical equipment, and so forth. Each of these kinds of electronic devices play some pivotal role in modern life.

What each of these electronic devices have in common is some kind of processor. Processors operate as the brains of electronic devices by implementing some functionality that has been encoded into a program that can be executed. To execute a program and thereby provide the desired device functionality, the processor uses memory to store the program code or the data on which the program operates. Thus, the processor and associated memory work together to execute programs.

One reason electronic devices are more common today is that modern electronic devices are so much more powerful than those of just a few years ago, not to mention ones from a few decades ago. One reason electronic devices are more powerful is that processors have become faster. Generally, the faster a processor can execute a program, the more interesting or beneficial is the functionality that the processor can provide. However, intrinsic processor speed alone does not determine an amount of functionality that an electronic device can provide because intrinsic processor speed alone does not control how quickly a processor can execute a program. The speed of memory associated with a processor, for example, also impacts program execution speed.

Accordingly, efforts have been made to increase the speed at which a processor can use memory to execute programs. One approach is to utilize a type of memory with relatively superior speed. Two example types of memory are dynamic random access memory (DRAM) and static random access memory (SRAM). On the one hand, the SRAM type is faster than the DRAM type. On the other hand, SRAM costs more because SRAM is both more complicated and occupies a larger chip area on a per-bit basis. Nevertheless, SRAM is often used for the memory that a processor accesses because superior speed can be worth the price- and chip-area premiums.

Another approach is to place a portion of the memory closer to the processor that is to access the memory and another portion further away. Having multiple levels of memory like this is called hierarchical memory. Two different levels of hierarchical memory are cache memory and main memory. The contents of a cache memory may be only part of the entire contents of the corresponding main memory. However, the cache memory is placed closer to the processor as compared to the main memory to reduce data access times. Moreover, with modern processors cache memory is typically integrated on a same integrated circuit (IC) chip as is the processor. This integration enables the processor to access the cache memory with significantly lower latencies.

In many modern processors, these two approaches are used in combination. In other words, a processor is provided a cache memory formed from SRAM cells. Such an SRAM cache memory can also be integrated with a processor on the same chip. Implementing these approaches does increase the speed at which a processor can use memory to execute programs and provide computing functionality. Unfortunately, even if these various approaches are implemented together, memory usage still causes a bottleneck for processing throughput. The time delays that occur because a processor is interacting with a slower memory continue to negatively impact the speed at which a processor can execute a program. Consequently, memory system deficiencies continue to hinder overall computing performance and limit the functionality that can be provided by modern electronic devices.

SUMMARY

In an example aspect, an integrated circuit is disclosed. The integrated circuit includes an output latch having a data storage unit, first output transition circuitry, and second output transition circuitry. The data storage unit includes a first input node configured to receive a first input voltage and a second input node configured to receive a second input voltage. The data storage unit also includes a first output node configured to provide a first output voltage and a second output node configured to provide a second output voltage. The first output transition circuitry is coupled to the first output node and includes a first control node coupled to the first input node. The first transition circuitry accelerates a voltage level transition of the first output voltage responsive to the first input voltage. The second output transition circuitry is coupled to the second output node and includes a first control node coupled to the second input node. The second transition circuitry accelerates a voltage level transition of the second output voltage responsive to the second input voltage.

In an example aspect, an integrated circuit is disclosed. The integrated circuit includes an output latch having a data storage unit configured to store complementary data values. The data storage unit includes a first input node configured to receive a first input voltage and a second input node configured to receive a second input voltage. The data storage unit also includes a first output node configured to provide a first output voltage and a second output node configured to provide a second output voltage. The output latch also includes first means for accelerating a voltage level transition of the first output voltage at the first output node responsive to the first input voltage. The output latch further includes second means for accelerating a voltage level transition of the second output voltage at the second output node responsive to the second input voltage.

In an example aspect, a method for accelerating memory access with an output latch is disclosed. The method includes receiving a first input voltage at a first input node of the output latch and receiving a second input voltage at a second input node of the output latch. Responsive to the first input voltage, a first output voltage at a first output node of the output latch is transitioned from a first logical value to a second logical value. Responsive to the second input voltage, a second output voltage at a second output node of the output latch is transitioned from the second logical value to the first logical value. The method further includes accelerating the logical value transitioning of the second output voltage from the second logical value to the first logical value using a first switch that is coupled between the second output node and a voltage rail.

In an example aspect, an integrated circuit is disclosed. The integrated circuit includes a memory element and an output latch. The memory element has a first storage line and a second storage line. The output latch is coupled to the memory element and includes a first output node and a second output node. The output latch also includes a first NAND gate, a second NAND gate, first output transition circuitry, and second output transition circuitry. The first NAND gate has a first input, a second input, and an output. For the first NAND gate, the first input is coupled to the first storage line, the second input is coupled to the second output node, and the output is coupled to the first output node. The second NAND gate has a first input, a second input, and an output. For the second NAND gate, the first input is coupled to the first output node, the second input is coupled to the second storage line, and the output is coupled to the second output node. The first output transition circuitry is coupled between the first output node and a ground node, with the first output transition circuitry including a first control node coupled to the first storage line. The second output transition circuitry is coupled between the second output node and the ground node, with the second output transition circuitry including a first control node coupled to the second storage line.

DETAILED DESCRIPTION

Figure 1:
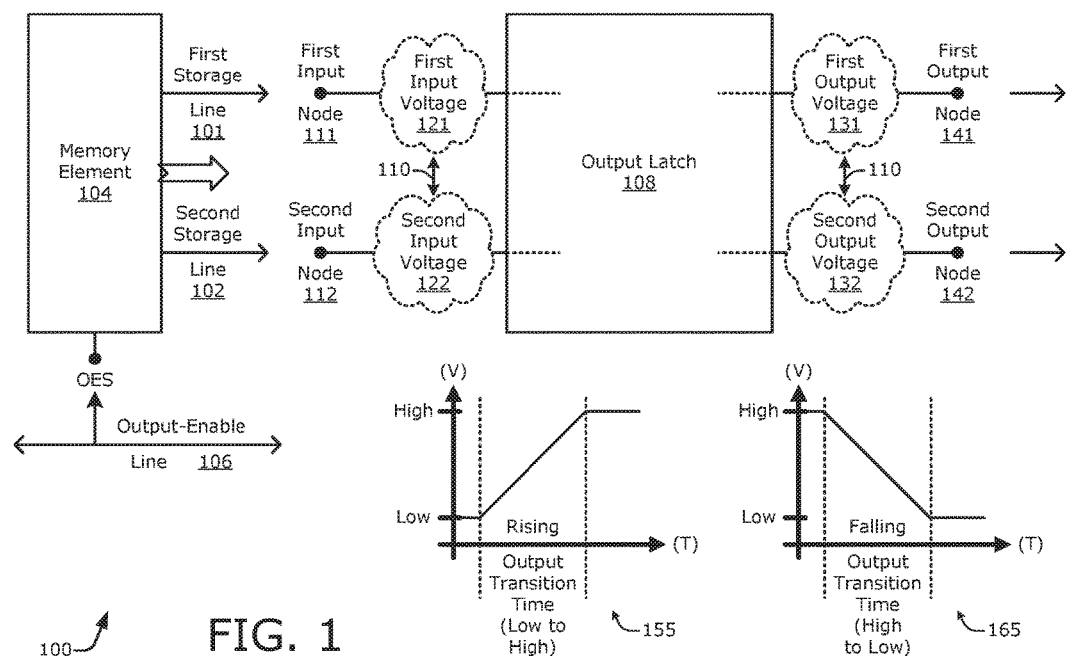
FIG. 1 illustrates an output latch that may be used with a memory element in accordance with example embodiments.

Electronic devices contribute to making many of life's modern conveniences a reality, and electronic devices function based on the interaction between processors and memory. A processor uses memory to enable the execution of a program that provides some functionality, such as streaming a video, issuing navigational instructions, monitoring a car's safety status, or performing an engineering analysis. The memory stores the program code and related data. During execution of the program, the processor loads code and data to perform operations on the data based on the code. The processor also stores data in the memory after the operations are performed. Program execution is therefore dependent on how quickly a processor can use the memory.

Memory speed may be affected by both intrinsic and extrinsic factors. One factor affecting the speed of execution of a program is therefore an intrinsic speed of the memory. Faster memory types can offer faster program execution speeds. For example, the faster SRAM is often favored over the slower, but cheaper, DRAM for high performance environments. Another factor affecting the speed of execution of a program is an extrinsic memory trait—memory access speed. Memory access speed is a speed at which a processor can write data to the memory or retrieve data from the memory. Such access speed can be increased by moving the memory closer to the processor, which decreases a length of a travel path traversed by requested data. Memory access speed can also be increased by decreasing an amount of time that transpires while the memory is providing the requested data.

To retrieve data from SRAM, for example, a sense amplifier senses stored data and provides the sensed data. Because SRAM stores data in a complementary form, the sense amplifier senses data values on two storage lines for each bit. As part of the sensing process to output data values, the sense amplifier pre-charges storage lines prior to the storage lines taking on values of the sensed data. To prevent the pre-charge values from propagating to downstream circuitry, such as static logic devices, a latch is used to secure and safely hold the sensed data. One type of latch is the set-reset (S-R) latch, which is capable of storing complementary data values. As used herein, the S-R latch is considered similar or analogous to the reset-set (R-S) latch. One kind of S-R latch is the NAND S-R latch that employs two cross-coupled NAND gates.

With a NAND S-R latch, one NAND gate receives a first data value as a first of two inputs, and the other NAND gate receives the complementary data value as a first of two inputs. As part of the cross-coupling arrangement, an output of each NAND gate is fed to the other NAND gate as the second of the two inputs. Due to the cross-coupled arrangement, the complementary data values at the inputs, and the logical NAND operation performed by each NAND gate, a first NAND gate can begin to transition its output as soon as a newly-sensed data value is received at the first input, but a second NAND gate cannot. The second NAND gate cannot change its output until the first NAND gate has transitioned its output.

In other words, the two NAND gates update their respective outputs in response to newly-sensed data values in a sequential order. The first NAND gate produces its updated output after one NAND gate operation delay. The second NAND gate, however, produces its updated output after two NAND gate operation delays. This sequential operation of the two NAND gates creates an extra delay period before the complementary data values are provided to complete the performance of a read operation as requested by a processor. The transitions of the data values output by a NAND S-R latch are therefore delayed.

With a NAND S-R latch having outputs with complementary data values, one output rises from a low value to a high value and the other output falls from a high value to a low value. The delays in the transitions of the values output by the S-R latch are asymmetric between a rising transition delay and a falling transition delay because of the sequential NAND gate operations. For a NAND S-R latch, the rising transition output delay is shorter because the rising transition occurs sooner. The rising transition is faster because the rising output is initiated after one NAND gate operation delay. The falling transition output delay, on the other hand, is longer because the falling transition occurs later. The falling transition is slower because the falling output is initiated after two NAND gate operation delays due to the sequential NAND gate operation of the two cross-coupled NAND gates.

Unfortunately, this asymmetry in the rising and falling transition times of NAND S-R latches is not merely an interesting quirk resulting from the logical NAND operations and the feedback instituted by the cross-coupled arrangement. Instead, these asymmetric rising and falling transition output times, particularly the longer falling transition time, adversely impact the memory accessing speed that can be attained by using a conventional S-R latch to read data from SRAM. By causing memory access times to increase, conventional S-R latches interfere with the interaction between a processor and associated memory to the detriment of computational performance, which impairs the functionality that can be provided by modern electronic devices.

In contrast with conventional approaches to S-R latch design, example implementations of output latches that are described herein accelerate an output transition, at least for the output that would otherwise experience two logic gate operation delays, to decrease a memory access time. Accordingly, a processor can obtain requested data sooner to continue computations that are dependent on the requested data.

In one or more embodiments, an output latch secures complementary data values via a first input node and a second input node and provides the complementary data values on a first output node and a second output node. The output latch includes a data storage unit, first output transition circuitry, and second output transition circuitry. The data storage unit includes two logic gates, such as two NAND gates. The complementary data values at the first input node and the second input node are realized as a first input voltage and a second input voltage. The complementary data values at the first output node and the second output node are realized as a first output voltage and a second output voltage.

The data storage unit accepts the first and second input voltages and presents the first and second output voltages for acquisition by downstream logic. The first output transition circuitry is coupled to the first output node, and the second output transition circuitry is coupled to the second output node. In operation, the first output transition circuitry can accelerate a voltage level transition of the first output node based on the first input voltage. The first output transition circuitry can initiate a change to the first output voltage sooner than two logic gate operation delays that may be caused by logic gates in the data storage unit. The second output transition circuitry can accelerate a voltage level transition of the second output node based on the second input voltage. The second output transition circuitry can initiate a change to the second output voltage sooner than two logic gate operation delays that may be caused by logic gates in the data storage unit.

In one implementation, the two logic gates of the data storage unit are realized with two NAND gates. In such an implementation, output transition circuitry accelerates a falling voltage level transition at an output node using at least one pull-down transistor that is coupled to a low voltage rail, such as a ground node. The pull-down transistor is turned on responsive to a voltage level of an input voltage at an input node. In another implementation, the two logic gates of the data storage unit are realized with two NOR gates. In such an implementation, output transition circuitry accelerates a rising voltage level transition at an output node using at least one pull-up transistor that is coupled to a high voltage rail, such as a voltage supply source. The pull-up transistor is turned on responsive to a voltage level of an input voltage at an input node.

In these manners, the output transition circuitry can affect an output voltage at an output node of the output latch faster than the data storage unit having two cross-coupled logic gates that operate sequentially. In effect, the output transition circuitry can bypass the sequential operation of the cross-coupled logic gates to initiate an output voltage transition before both logic gates complete a logical operation. Moreover, an output latch with the output transition circuitry can provide stored data values to a requesting processor faster than the data storage unit alone so as to facilitate overall computational performance.

FIG. 1 illustrates generally at 100 an output latch 108 that may be used with a memory element 104 in accordance with example embodiments. The memory element 104 outputs data on a first storage line 101 and a second storage line 102 responsive to an output-enable signal (OES) on an output-enable line 106. The output latch 108 includes a first input node 111, a second input node 112, a first output node 141, and a second output node 142. Two graphs are also depicted: a rising output transition graph 155, and a falling output transition graph 165.

The memory element 104 stores information, such as a program code or data to be used by a processor when executing the code. The memory element 104 may include a memory cell that stores at least one bit of data, may include a memory array that includes multiple bytes of data, and so forth. Examples of the memory element 104 include a cache memory, a main memory, dynamic flip-flops, dual-valued data sources, and combinations thereof. Memory element 104 may be implemented as SRAM, a StrongArm flip-flop, storage with a dual rail domino-static interface, and so forth. In example implementations, the first storage line 101 and the second storage line 102 propagate or provide dual-valued data or complementary data values. The memory element 104 outputs data on the first storage line 101 and the second storage line 102 responsive to the output-enable signal on the output-enable line 106. Examples of the output-enable signal include a sense amplifier enable signal (e.g., for an SRAM memory element 104), a clock signal (e.g., for a clocked flip-flop memory element 104), or some combination thereof.

In one or more embodiments, the output latch 108 is operatively coupled to the memory element 104. The first input node 111 is coupled to the first storage line 101, and the second input node 112 is coupled to the second storage line 102. The first storage line 101 provides a first input voltage 121 to the first input node 111. The second storage line 102 provides a second input voltage 122 to the second input node 112. As indicated by an arrow 110, the first input voltage 121 has a value or voltage level that is the complement of a value or voltage level of the second input voltage 122. For example, if the first input voltage 121 is zero, the second input voltage 122 is one, or vice versa. Based on the first input voltage 121 and the second input voltage 122, the output latch 108 provides a first output voltage 131 on the first output node 141 and a second output voltage 132 on the second output node 142. As indicated by an arrow 110, the first output voltage 131 has a value or voltage level that is the complement of a value or voltage level of the second output voltage 132. For example, if the first output voltage 131 is one, the second output voltage 132 is zero, or vice versa. A high-level example implementation of the output latch 108 is described herein with reference to FIG. 2.

In a digital binary system, the first output voltage 131 and the second output voltage 132 transition from a low voltage level to a high voltage level or from a high voltage level to a low voltage level. More specifically, for complementary-valued voltages, if the first output voltage 131 transitions from a low voltage level to a high voltage level, the second output voltage 132 transitions from a high voltage level to a low voltage level. In this example scenario, the first output voltage 131 experiences a rising output transition, and the second output voltage 132 experiences a falling output transition.

The rising output transition graph 155 shows a voltage (V) increasing from a low voltage level to a high voltage level over a period of time (T) that is indicated as a rising output transition time (from low to high). The falling output transition graph 165 shows a voltage decreasing from a high voltage level to a low voltage level over a time period that is indicated as a falling output transition time (from high to low). Depending on the interior circuitry of the output latch 108, the rising output transition time may differ from the falling output transition time. This asymmetry of the output transition times as caused by the output latch 108 can slow access to the contents of the memory element 104. As described herein, this asymmetry can be reduced, and memory access time can be decreased, by accelerating at least the slower of the two output transition times.

Figure 2:
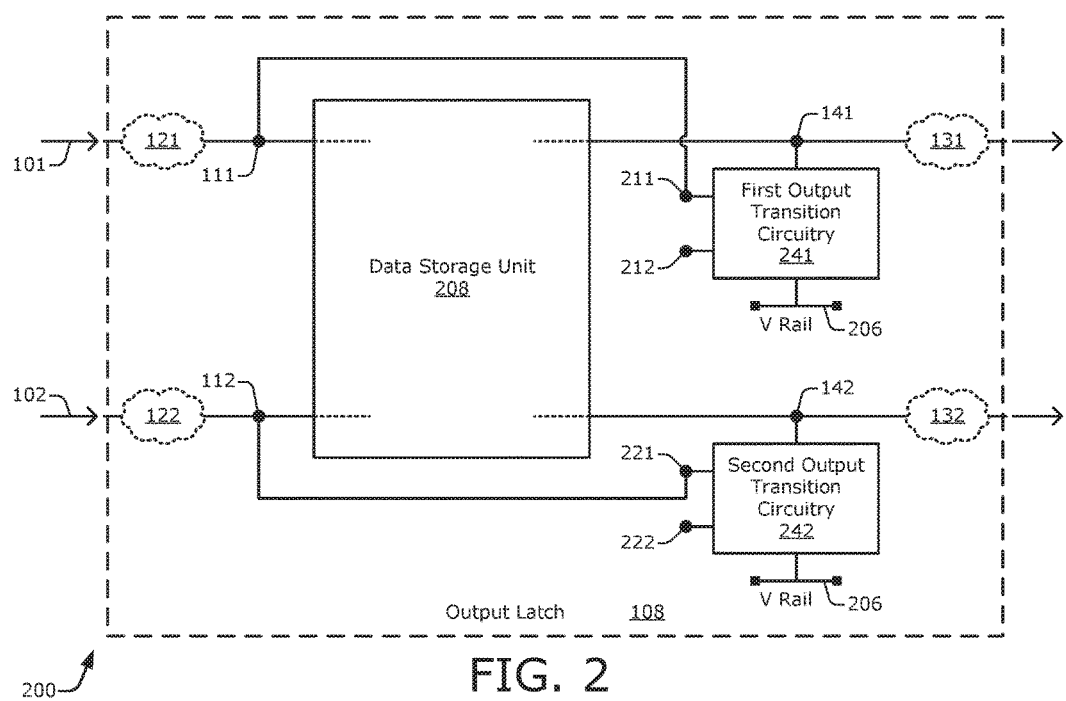
FIG. 2 illustrates an example output latch having a data storage unit, first output transition circuitry, and second output transition circuitry.

FIG. 2 illustrates generally at 200 an example output latch 108 having a data storage unit 208, first output transition circuitry 241, and second output transition circuitry 242. The output latch 108 receives the first input voltage 121 at the first input node 111 via the first storage line 101. The output latch 108 also receives the second input voltage 122 at the second input node 112 via the second storage line 102. The data storage unit 208 secures the data and holds the data at the first output node 141 and the second output node 142. The data storage unit 208 is capable of driving the first output voltage 131 on the first output node 141 and the second output voltage 132 on the second output node 142.

Generally, the data storage unit 208 can propagate voltage levels of the first input voltage 121 at the first input node 111 and voltage levels of the second input voltage 122 at the second input node 112 to the first output voltage 131 at the first output node 141 and the second output voltage 132 at the second output node 142 using a latch, such as an S-R latch. However, operations of the internal circuitry of the data storage unit 208 can result in asymmetrical timings for when the output voltages are driven on the output nodes. The output transition circuitry can accelerate at least some of the output voltage transitions at the output nodes, which reduces the asymmetrical timings.

In one or more embodiments, output transition circuitry accelerates the slower of the two output voltage transitions. The first output transition circuitry 241 is coupled between the first output node 141 and a voltage rail 206. The first output transition circuitry 241 includes a first control node 211 and a second control node 212. The first control node 211 is coupled to the first input node 111 to receive the first input voltage 121. The second output transition circuitry 242 is coupled between the second output node 142 and the voltage rail 206. The second output transition circuitry 242 includes a first control node 221 and a second control node 222. The first control node 221 is coupled to the second input node 112 to receive the second input voltage 122. Connectivity and operational relevance of the second control node 212 of the first output transition circuitry 241 and the second control node 222 of the second output transition circuitry 242 are described with reference to FIG. 3.

In operation, the output transition circuitry that is coupled to the output node having the slower output voltage transition is activated. For example, assume the first output node 141 has the slower output voltage transition. The first output transition circuitry 241 is activated responsive to inputs at the first control node 211 and the second control node 212. Based on the activation, the first output transition circuitry 241 pulls the first output voltage 131 toward the voltage level of the voltage rail 206 faster than the data storage unit 208 can drive the first output node 141 to the correct level for the first output voltage 131.

A voltage for the voltage rail 206 can vary. For example, the voltage level of the voltage rail 206 can be provided by a high or positive voltage source, can be provided by a low or negative voltage source, can correspond to ground, and so forth. A general implementation for the data storage unit 208 and the voltage rail 206 is described with reference to FIG. 3. An implementation in which the data storage unit 208 is based on NAND gates and the voltage rail 206 corresponds to a ground node is described with reference to FIG. 4. An implementation in which the data storage unit 208 is based on NOR gates and the voltage rail 206 corresponds to a high voltage source is described with reference to FIG. 5.

Figure 3:
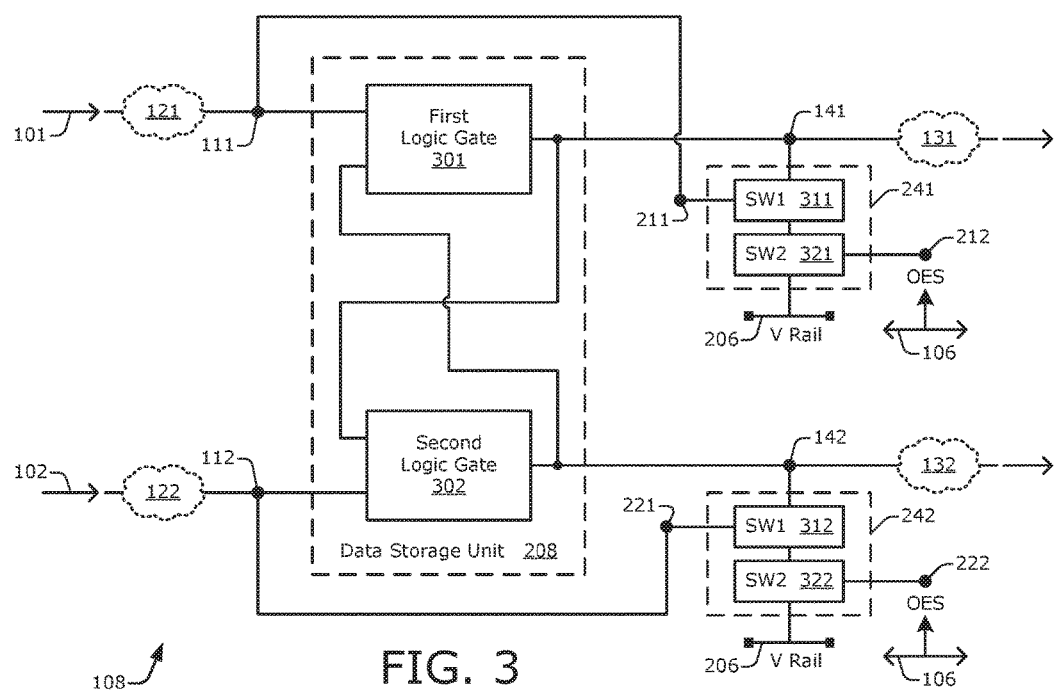
FIG. 3 illustrates an example data storage unit and example implementations for the first and second output transition circuitry.

FIG. 3 illustrates for an output latch 108 an example data storage unit 208 and an example implementation for the first output transition circuitry 241 and for the second output transition circuitry 242. The data storage unit 208 includes multiple logic gates: a first logic gate 301, and a second logic gate 302. As shown, the data storage unit 208 includes a pair of cross-coupled logic gates 301 and 302. Each of the output transition circuitries includes multiple switches. The first output transition circuitry 241 includes a first switch 311 and a second switch 321. The second output transition circuitry 242 includes a first switch 312 and a second switch 322.

In the example data storage unit 208, the two logic gates are in a cross-coupled arrangement. The first logic gate 301 has a first input (upper left) that is coupled to the first input node 111 and a second input (lower left) that is coupled to the second output node 142. The first logic gate 301 has an output (right) that is coupled to the first output node 141 to generate the first output voltage 131 thereat. The second logic gate 302 has a first input (upper left) that is coupled to the first output node 141 and a second input (lower left) that is coupled to the second input node 112. The second logic gate 302 has an output (right) that is coupled to the second output node 142 to generate the second output voltage 132 thereat.

In each of the example output transition circuitries, two switches are coupled in series between an output node and the voltage rail 206. In the first output transition circuitry 241, the first switch 311 is coupled to the first output node 141, and the second switch 321 is coupled to the voltage rail 206. However, the locations of the first and second switches may be swapped. The first control node 211 of the first output transition circuitry 241 is coupled to the first input node 111 and controls a state of the first switch 311. The second control node 212 is coupled to the output-enable line 106 to receive the output-enable signal (OES) to control a state of the second switch 321. A switch may have or be in an active or closed state or may have or be in an inactive or open state based on a signal provided to a corresponding control node.

In the second output transition circuitry 242, the first switch 312 is coupled to the second output node 142, and the second switch 322 is coupled to the voltage rail 206. However, the locations of the first and second switches may be swapped. The first control node 221 of the second output transition circuitry 242 is coupled to the second input node 112 and controls a state of the first switch 312. The second control node 222 is coupled to the output-enable line 106 to receive the output-enable signal to control a state of the second switch 322.

With complementary data values being signaled on the first storage line 101 and the second storage line 102, the first input voltage 121 and the second input voltage 122 transition to different voltage levels responsive to stored data values being provided from the memory element 104 of FIG. 1. Due to the different voltage levels at the first input node 111 and the second input node 112, as well as the cross-coupled arrangement of the first logic gate 301 and the second logic gate 302, one of the logic gates cannot update its output until the other logic gate has updated its output. Thus, the two logic gates operate in a sequential fashion. Consequentially, one output voltage level is updated after one logic gate operation delay, but the other output voltage level is not updated until two logic gate operation delays. To counteract or ameliorate this extended delay, the output voltage level transition of the output node corresponding to the two logic gate operation delays is accelerated using one of the two output transition circuitries.

Each of the first output transition circuitry 241 and the second output transition circuitry 242 is in an active mode if both switches are active (e.g., closed). The second switch 321 of the first output transition circuitry 241 and the second switch 322 of the second output transition circuitry 242 are placed in the active state by the second control node 212 and the second control node 222, respectively, responsive to the output-enable signal. The first output transition circuitry 241 and the second output transition circuitry 242 can therefore be placed in an active mode if the output-enable signal is asserted on the output-enable line 106.

However, an output transition circuitry remains in an inactive mode unless the corresponding first switch is also placed in active state. Assume the first output transition circuitry 241 is entering an active mode. The output-enable signal is asserted at the second control node 212 to close the second switch 321. The newly-obtained value at the first input node 111 is provided to the first control node 211. In this example, the newly-obtained value activates the first switch 311 by closing the first switch 311. With both switches in an active state, current can flow between the first output node 141 and the voltage rail 206, and the first output transition circuitry 241 enters an active mode. In the active mode, the first output transition circuitry 241 pulls the first output voltage 131 at the first output node 141 up or down toward the voltage level of the voltage rail 206. This pulling of the voltage accelerates the output voltage transition at the first output node 141 without having to wait for both logic gates to process the new values at the two input nodes to the data storage unit 208. Example implementations for the logic gates, the switches, and different operational control values are described with reference to FIG. 4.

Figure 4:
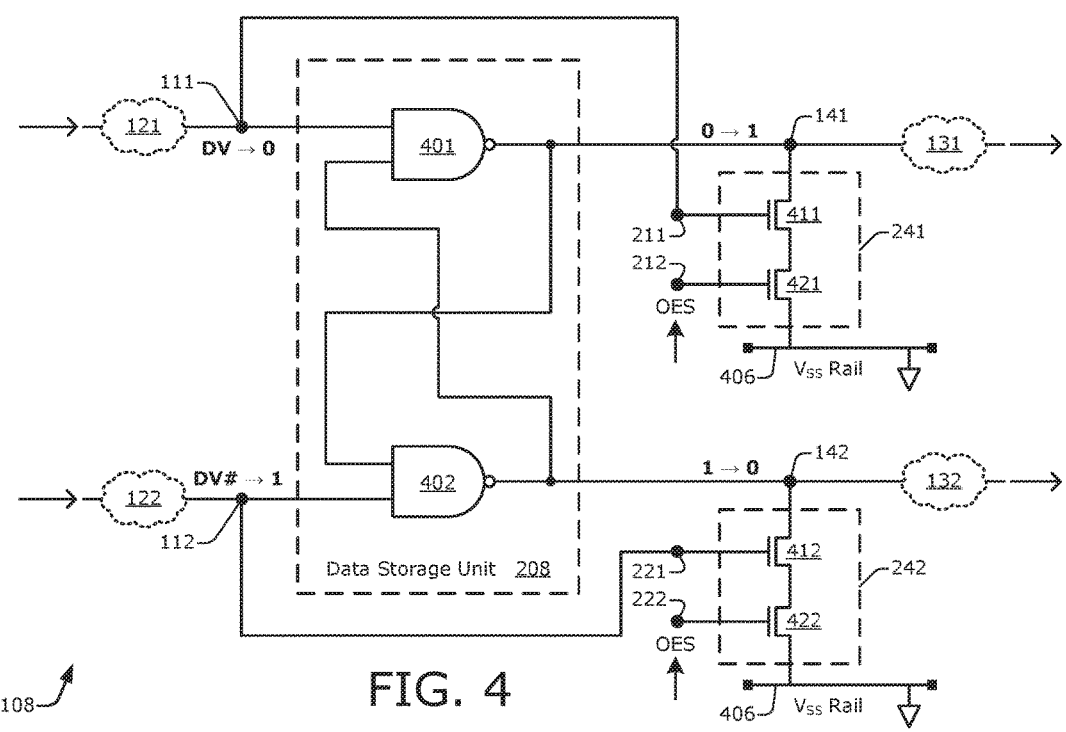
FIG. 4 illustrates an example NAND gate-based implementation for an output latch.

FIG. 4 illustrates an example NAND gate-based implementation for the output latch 108. As shown, the data storage unit 208 includes multiple NAND gates: a first NAND gate 401 and a second NAND gate 402. The two NAND gates are implemented like a NAND S-R latch. Each of the output transition circuitries includes multiple transistors. The first output transition circuitry 241 includes a first transistor 411 and a second transistor 421. The second output transition circuitry 242 includes a first transistor 412 and a second transistor 422.

In a comparison of FIG. 3 to FIG. 4, the first logic gate 301 is implemented as the first NAND gate 401, and the second logic gate 302 is implemented as the second NAND gate 402. The four switches of the output transition circuitries in FIG. 3 are each implemented as an n-type metal-oxide-semiconductor (NMOS) transistor in FIG. 4. The voltage rail 206 is implemented as a voltage rail 406 ($V_{SS}$) corresponding to a ground node.

In the example data storage unit 208, the two NAND gates are in a cross-coupled arrangement. The first NAND gate 401 has a first input (upper left) that is coupled to the first input node 111 and a second input (lower left) that is coupled to the second output node 142. The first NAND gate 401 has an output (right) that is coupled to the first output node 141 and drives the first output voltage 131 at the first output node 141. The second NAND gate 402 has a first input (upper left) that is coupled to the first output node 141 and a second input (lower left) that is coupled to the second input node 112. The second NAND gate 402 has an output (right) that is coupled to the second output node 142 and drives the second output voltage 132 at the second output node 142.

Each of the example output transition circuitries includes a transistor stack. The first output transition circuitry 241 includes a first transistor stack, and the second output transition circuitry 242 includes a second transistor stack. In each transistor stack, two transistors are coupled in series between an output node and the voltage rail 406. In the first output transition circuitry 241, a first transistor 411 is coupled to the first output node 141, and a second transistor 421 is coupled to the voltage rail 406. The first control node 211 of the first output transition circuitry 241 is coupled to the first input node 111 and corresponds to the gate of the first transistor 411. The second control node 212 is coupled to the output-enable line 106 (not shown in FIG. 4) to receive the output-enable signal (OES) at the gate of the second transistor 421.

In the second output transition circuitry 242, a first transistor 412 is coupled to the second output node 142, and a second transistor 422 is coupled to the voltage rail 406. The first control node 221 of the second output transition circuitry 242 is coupled to the second input node 112 and corresponds to the gate of the first transistor 412. The second control node 222 is coupled to the output-enable line 106 to receive the output-enable signal at the gate of the second transistor 422. If both transistors of a transistor stack are turned on for a given output transition circuitry, current flows from the corresponding output node to the voltage rail 406. This current flow causes the corresponding output node to be pulled down to the voltage level of the voltage rail 406, which is ground in this example.

With complementary data values, the first input voltage 121 and the second input voltage 122 transition to different voltage levels responsive to stored data values being provided from the memory element 104 of FIG. 1. In a previous state of the data storage unit 208, the first input node 111 was a 1, the first output node 141 was a zero, the second input node 112 was a 0, and the second output node 142 was a 1. Example complementary data values for a transition to a current state are depicted in FIG. 4 in bold. As depicted near the first input node 111 with a transitional arrow, the data value (DV) transitions from a 1 to a 0 at an initial time of the current state. Consequently, as depicted near the second input node 112, the data value_bar (DV#) transitions from a 0 to a 1. Thus, at an initial time of the current state, the first NAND gate 401 has a 0 at the first input (upper left) due to the transition of the data value (DV) and a 1 at the second input (lower left). Based on these two values and in accordance with a logical NAND operation, the output of the first NAND gate 401 begins to transition from a 0 to a 1. This 0-to-1 transition is depicted near the first output node 141. The second NAND gate 402, on the other hand, has a 0 at the first input (upper left) and a 1 at the second input (lower left) due to the transition of the data value_bar (DV#) at the initial time of the current state. The output of the second NAND gate 402 therefore continues to be a 1 without operation of the second output transition circuitry 242.

In the absence of both the first output transition circuitry 241 and the second output transition circuitry 242, operation of the output latch 108 would proceed in the following manner. No transition begins at the second output node 142 at the initial time of the current state because the second NAND gate 402 has inputs of 0 and 1. However, after the first NAND gate 401 completes the logical NAND operation, the output thereof transitions from 0 to 1. After this transition, the second NAND gate 402 has a 1 at the first input and a 1 at the second input. In accordance with a logical NAND operation, the output of the second NAND gate 402 begins to transition from 1 to a 0. This 1-to-0 transition is depicted near the second output node 142. Unfortunately, in the absence of the output transition circuitry, this transition at the second output node 142 does not occur due to the data storage unit 208 until after two sequential NAND gate operations have occurred, a first operation performed by the first NAND gate 401 followed by a second operation performed by the second NAND gate 402.

However, an output transition of the first output node 141 or the second output node 142 can be accelerated using the first output transition circuitry 241 or the second output transition circuitry 242, respectively. In this scenario, the first output node 141 has a rising output voltage transition, and the second output node 142 has a falling output voltage transition. Here, the second output node 142 transitions after, and thus apparently more slowly than, the first output node 141 transitions based on the NAND gates of the data storage unit 208 in the absence of acceleration as described herein. However, the second output transition circuitry 242 is configured to accelerate the falling output voltage transition of the second output node 142 based on the second input voltage 122 at the second input node 112. The gate of the first transistor 412 is coupled to the second input node 112. Because the first transistor 412 is an NMOS transistor, the first transistor 412 is turned on when the data value_bar (DV#) takes on a high voltage value.

In this example, the output-enable signal (OES) is active high. Thus, the output-enable signal is driven to a high voltage value as an indication to read a data value from the memory element 104. The gate of the second transistor 422 is coupled to the output-enable line 106 to receive the output-enable signal. Because the second transistor 422 is an NMOS transistor, the second transistor 422 is turned on when the output-enable signal takes on a high voltage value. Thus, both the first transistor 412 and the second transistor 422 are turned on, which permits current to flow between the second output node 142 and the voltage rail 406, which corresponds to the ground node here. The second output voltage 132 at the second output node 142 is therefore pulled down to 0 by the transistor stack of the second output transition circuitry 242. By pulling the output voltage down at the second output node 142, the second output transition circuitry 242 accelerates the transition of the voltage level of the second output voltage 132 for this falling transition scenario. When the data value (DV) and the data value_bar (DV#) have opposite voltage levels than those that are depicted in FIG. 4 and described above, the first output transition circuitry 241 accelerates a falling output voltage transition of the first output voltage 131 at the first output node 141.

Figure 5:
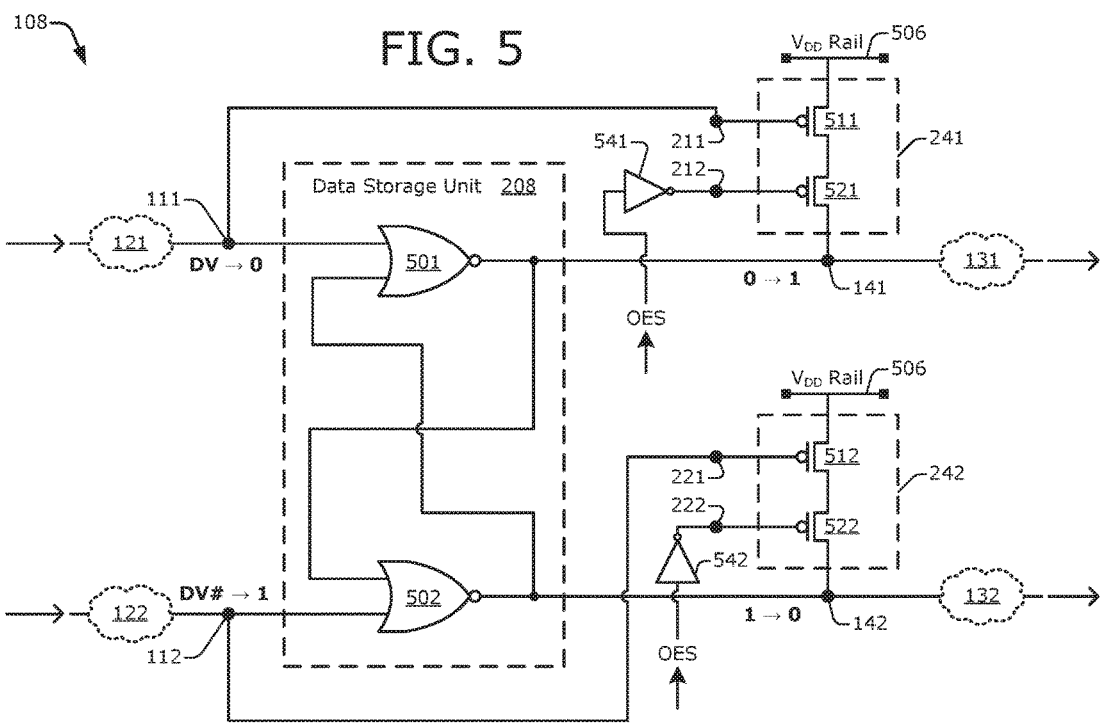
FIG. 5 illustrates an example NOR gate-based implementation for an output latch.

FIG. 5 illustrates an example NOR gate-based implementation for an output latch 108. As shown, the data storage unit 208 includes multiple NOR gates: a first NOR gate 501 and a second NOR gate 502. The two NOR gates are implemented like a NOR S-R latch. Each of the output transition circuitries includes multiple transistors. The first output transition circuitry 241 includes a first transistor 511 and a second transistor 521. The second output transition circuitry 242 includes a first transistor 512 and a second transistor 522.

The example output latch 108 of FIG. 5 is similar or analogous to the example output latch 108 of FIG. 4. As shown, each example output latch 108 includes analogous circuit devices that are similarly interconnected. However, there are a few differences. First, two inverters are added to FIG. 5: a first inverter 541 and a second inverter 542. The inverters are positioned to invert the output-enable signal (OES) prior to the signal being applied to the second control nodes 212 and 222 of the output transition circuitries. Inside the data storage unit 208, the first NOR gate 501 replaces the first NAND gate 401, and the second NOR gate 502 replaces the second NAND gate 402. Also, each of the NMOS transistors of FIG. 4 are replaced by p-type metal-oxide-semiconductor (PMOS) transistors in FIG. 5. Specifically, the first transistor 411 is replaced by the first transistor 511, the second transistor 421 is replaced by the second transistor 521, the first transistor 412 is replaced by the first transistor 512, and the second transistor 422 is replaced by the second transistor 522. Additionally, with the output latch 108 of FIG. 5, the voltage rail 206 is implemented as a voltage rail 506 ($V_{DD}$) corresponding to a high supply voltage source.

Thus, each of the example output transition circuitries includes a transistor stack in this NOR gate-based implementation of the data storage unit 208. The first output transition circuitry 241 includes a first transistor stack, and the second output transition circuitry 242 includes a second transistor stack. In each transistor stack, two transistors are coupled in series between the voltage rail 506 and an output node. In the first output transition circuitry 241, the first transistor 511 is coupled to the voltage rail 506, and the second transistor 521 is coupled to the first output node 141. The first control node 211 of the first output transition circuitry 241 is coupled to the first input node 111 and corresponds to the gate of the first transistor 511. The second control node 212 is coupled to the output-enable line 106 (not shown in FIG. 5) to receive the output-enable signal (OES) at the gate of the second transistor 521.

In the second output transition circuitry 242, the first transistor 512 is coupled to the voltage rail 506, and the second transistor 522 is coupled to the second output node 142. The first control node 221 of the second output transition circuitry 242 is coupled to the second input node 112 and corresponds to the gate of the first transistor 512. The second control node 222 is coupled to the output-enable line 106 to receive the output-enable signal at the gate of the second transistor 522. If both transistors of a transistor stack are turned on for a given output transition circuitry, current flows from the voltage rail 506 to the corresponding output node. This current flow causes the corresponding output node to be pulled up to the voltage level of the voltage rail 506, which is a high supply voltage level in this example.

A NOR gate-based S-R latch operates in accordance with a logical NOR operation, so the sequential ordering of the operations of the two NOR gates is flipped as compared to the NAND gate-based S-R latch of FIG. 4. In other words, the falling output transition occurs first with the NOR gate-based S-R latch, and the rising output transition occurs second. Consequently, the output transition circuitry is configured to accelerate a rising output voltage transition. To enable the output transition circuitry to pull the output voltage up, the output transition circuitries are coupled between the output nodes and the high supply voltage as represented by the voltage rail 506.

In a previous state of the data storage unit 208, the first input node 111 was a 1, the first output node 141 was a zero, the second input node 112 was a 0, and the second output node 142 was a 1. Example complementary data values for a transition to a current state are depicted in FIG. 5 in bold. As depicted near the first input node 111 with a transitional arrow, the data value (DV) transitions from a 1 to a 0 at an initial time of the current state. As depicted near the second input node 112, the data value_bar (DV#) transitions from a 0 to a 1. Thus, at an initial time of the current state, the second NOR gate 502 has a 0 at the first input (upper left) and a 1 at the second input (lower left) due to the transition of the data value_bar (DV#). Based on these two values and in accordance with a logical NOR operation, the output of the second NOR gate 502 begins to transition from a 1 to a 0. This 1-to-0 transition is depicted near the second output node 142. On the other hand, the first NOR gate 501 has a 0 at the first input (upper left) due to the transition of the data value (DV) and a 1 at the second input (lower left) at the initial time of the current state. The output of the first NOR gate 501 therefore continues to be a 0 without operation of the first output transition circuitry 241.

In the absence of both the first output transition circuitry 241 and the second output transition circuitry 242, operation of the output latch 108 would proceed in the following manner. No transition begins at the first output node 141 at the initial time of the current state because the first NOR gate 501 has inputs of 0 and 1. However, after the second NOR gate 502 completes the logical NOR operation, the output thereof transitions from 1 to 0. After this transition, the first NOR gate 501 has a 0 at the first input and a 0 at the second input. In accordance with a logical NOR operation, the output of the first NOR gate 501 begins to transition from a 0 to a 1. This 0-to-1 transition is depicted near the first output node 141. Unfortunately, in the absence of the output transition circuitry, this transition at the first output node 141 does not occur due to the data storage unit 208 until after two sequential NOR gate operations have occurred, a first operation performed by the second NOR gate 502 followed by a second operation performed by the first NOR gate 501.

However, an output transition of the first output node 141 or the second output node 142 can be accelerated using the first output transition circuitry 241 or the second output transition circuitry 242, respectively. In this scenario, the first output node 141 has a rising output voltage transition, and the second output node 142 has a falling output voltage transition. Here, the first output node 141 transitions after, and thus apparently more slowly than, the second output node 142 transitions based on the operations of the NOR gates of the data storage unit 208 in the absence of acceleration as described herein. However, the first output transition circuitry 241 is configured to accelerate the rising output voltage transition of the first output node 141 based on the first input voltage 121 at the first input node 111. The gate of the first transistor 511 is coupled to the first input node 111. Because the first transistor 511 is a PMOS transistor, the first transistor 511 is turned on when the data value (DV) takes on a low voltage value.

In this example, the output-enable signal (OES) is active high. The output-enable signal is driven to a high voltage value as an indication to read a data value from the memory element 104. The gate of the second transistor 521 is coupled to an inverted version of the output-enable signal received from the output-enable line 106 via the first inverter 541. Because the second transistor 521 is a PMOS transistor, the second transistor 521 is turned on when the output-enable signal takes on a high voltage value due to the signal inversion of the first inverter 541. Thus, both the first transistor 511 and the second transistor 521 are turned on, which permits current to flow between the first output node 141 and the voltage rail 506, which corresponds to the supply voltage rail. The first output voltage 131 at the first output node 141 is therefore pulled up to 1 by the transistor stack of the first output transition circuitry 241. By pulling the output voltage up at the first output node 141, the first output transition circuitry 241 accelerates the transition of the voltage level of the first output voltage 131 for this rising transition scenario. When the data value (DV) and the data value_bar (DV#) have opposite voltage levels than those that are depicted in FIG. 5 and described above, the second output transition circuitry 242 accelerates a rising output voltage transition of the second output voltage 132 at the second output node 142.

Figure 6:
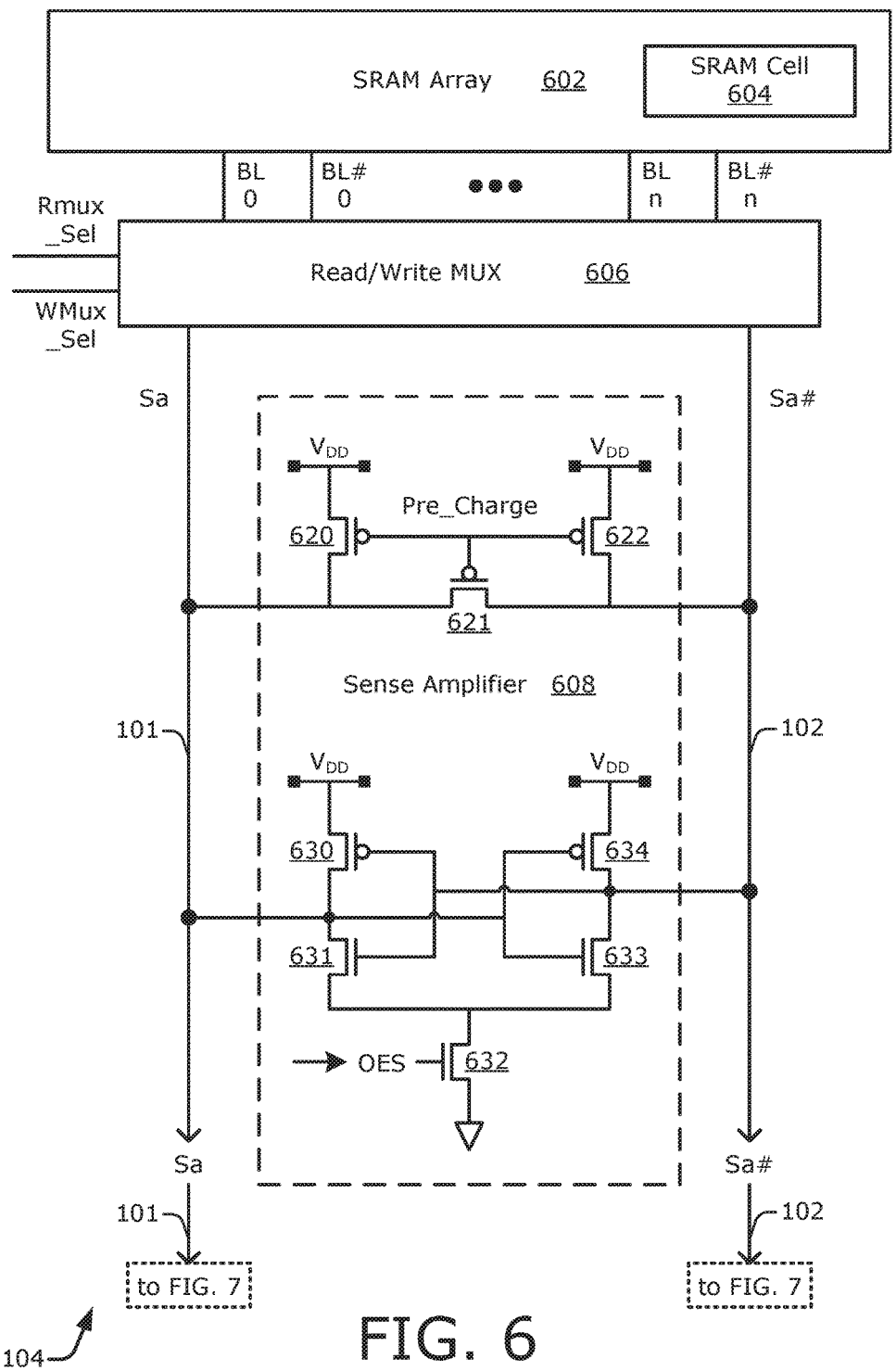
FIG. 6 illustrates an example SRAM implementation for a memory element.

FIG. 6 illustrates an example SRAM implementation for a memory element 104. In this example implementation, the memory element 104 includes an SRAM array 602, a read/write multiplexer 606, and a sense amplifier 608, as well as the first storage line 101 and the second storage line 102. The SRAM array 602 is coupled to the read/write multiplexer 606, and the read/write multiplexer 606 is coupled to the sense amplifier 608. The SRAM array 602 includes multiple instances of an SRAM cell 604 that each store one bit of data.

Selection between a read operation and a write operation for the read/write multiplexer 606 is controlled by a read multiplexing select signal (Rmux_Sel) and a write multiplexing select signal (WMux_Sel). The read/write multiplexer 606 is coupled to the SRAM array 602 via multiple bit line pairs. For example, bit line pairs from BL0 and BL#0 to BLn and BL#n are depicted, with "n" usually taking a positive even integer value, such as 4 or 16. The read/write multiplexer 606 reads data values from two bit lines of a bit line pair at a time. The read/write multiplexer 606 outputs the selected data values, labeled Sa and Sa#, on the first storage line 101 and the second storage line 102.

The sense amplifier 608 includes multiple transistors separated into two major sections: a pre-charge section in the upper third of the sense amplifier 608 and a sense-amplification section in the lower two-thirds of the sense amplifier 608. The pre-charge section includes three PMOS transistors: a transistor 620, a transistor 621, and a transistor 622. Each of the transistor 620 and the transistor 622 is coupled between a supply voltage rail ($V_{DD}$) and the first storage line 101 and the second storage line 102, respectively. The transistor 621 is coupled between the first storage line 101 and the second storage line 102. The gates of these three transistors are coupled together at a common pre_charge node. In operation, before requested data values are placed on the first storage line 101 and the second storage line 102, a pre_charge signal (not explicitly shown) at the common pre_charge node causes the transistors 620, 621, and 622 to pre-charge the first storage line 101 and the second storage line 102 to a high voltage level.

The sense-amplification section includes five transistors as shown. Two PMOS transistors are a transistor 630 and a transistor 634. Three NMOS transistors are a transistor 631, a transistor 632, and a transistor 633. The transistor 630 and the transistor 631 are coupled in series between the supply voltage rail ($V_{DD}$) and the transistor 632. The transistor 634 and the transistor 633 are coupled in series between the supply voltage rail ($V_{DD}$) and the transistor 632. The transistor 632 is also coupled to ground. A gate of the transistor 632 is coupled to the output-enable line 106 (not shown in FIG. 6) to receive the output-enable signal (OES). The gates of the transistors 630 and 631 are coupled to a node between the transistor 634 and the transistor 633 as well as the second storage line 102. The gates of the transistors 634 and 633 are coupled to a node between the transistor 630 and the transistor 631 as well as the first storage line 101.

In operation, if the output-enable signal turns on the transistor 632, the stacked transistors 630 and 631 and the stacked transistors 634 and 633 sense the voltage values Sa and Sa# that are output from the read/write multiplexer 606. The stacked transistors 630 and 631 and the stacked transistors 634 and 633 also amplify these voltage values and present the amplified voltage values Sa and Sa# on the first storage line 101 and the second storage line 102, respectively. The amplified voltage values Sa and Sa# are provided to the output latch 108 via the first storage line 101 and the second storage line 102 as shown in FIG. 7.

Figure 7:
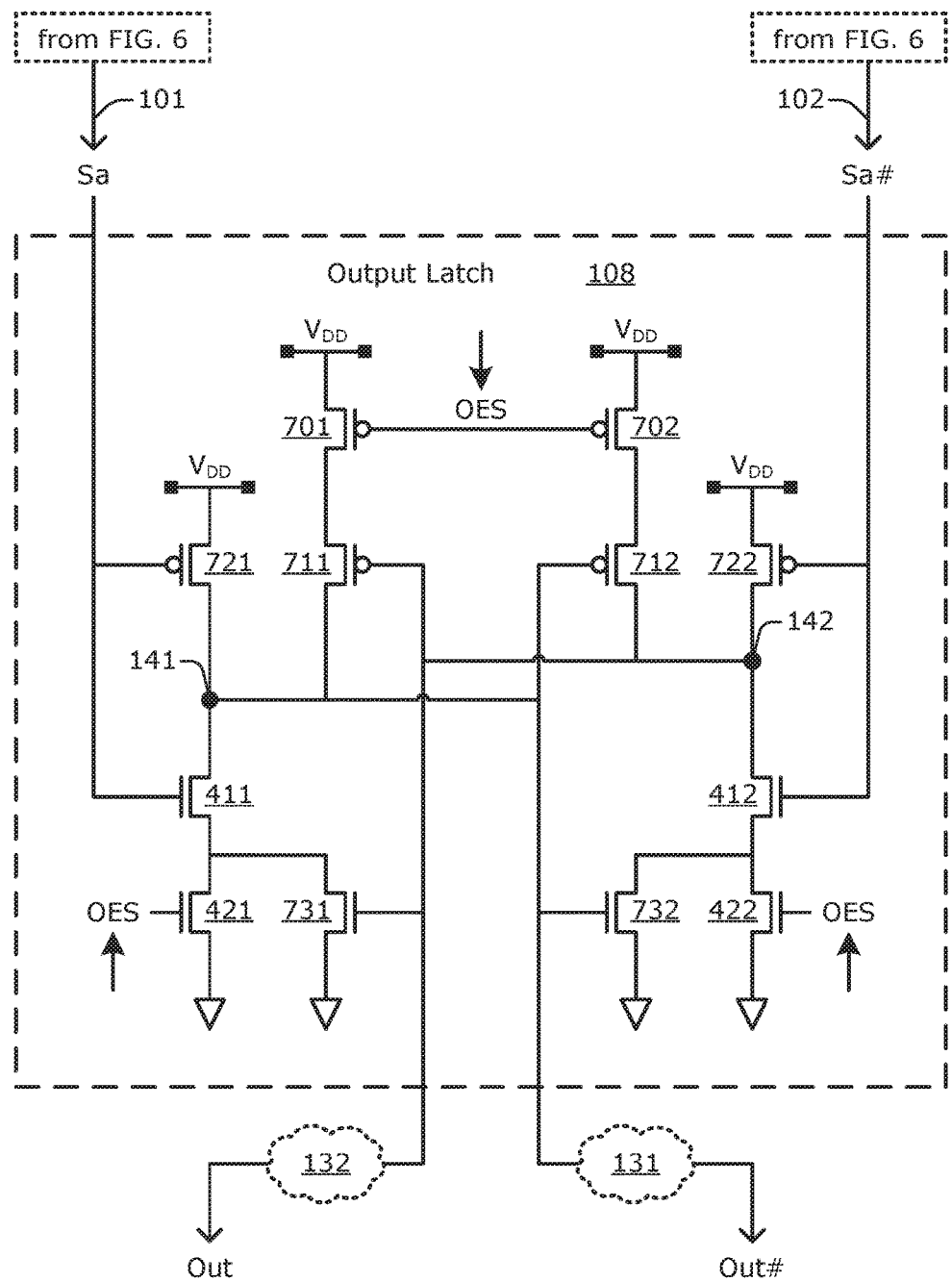
FIG. 7 illustrates an example output latch implementation, which is depicted at the transistor level, for interfacing with an SRAM memory element.

FIG. 7 illustrates an example implementation for the output latch 108, which is depicted at the transistor level, for interfacing with SRAM. As shown in FIG. 6, the amplified voltage values Sa and Sa# are provided on the first storage line 101 and the second storage line 102, respectively, by the sense amplifier 608. These amplified voltage values Sa and Sa# are received by the output latch 108 via the first storage line 101 and the second storage line 102. The output latch 108 is implemented to enable read access to the SRAM cell 604 responsive to the output-enable signal (OES). The data values Sa and Sa# correspond to the data values DV and DV# of FIGS. 4 and 5, respectively, for an SRAM implementation or other memory implementation that uses a sense amplifier. Nevertheless, the example output latch 108 shown in FIG. 7 is applicable to other types of memory elements 104 of FIG. 1. The output latch 108 includes 12 transistors. There are six PMOS transistors depicted in the top half of the output latch 108: a transistor 701, a transistor 702, a transistor 721, a transistor 711, a transistor 712, and a transistor 722. Six NMOS transistors are depicted in the lower half: the first transistor 411, the first transistor 412, the second transistor 421, a transistor 731, a transistor 732, and the second transistor 422.

With reference to FIG. 4, the illustrated NAND gate-based output latch 108 includes a first NAND gate 401, a second NAND gate 402, first output transition circuitry 241, and second output transition circuitry 242. The output latch 108 illustrated in FIG. 7 is also based on NAND gates. Generally, a NAND gate can be formed from four transistors. Two PMOS transistors are coupled in parallel with respect to each other and are both coupled to the supply voltage rail ($V_{DD}$). Two NMOS transistors are coupled in series with respect to each other and are both coupled to the ground. The two PMOS transistors together are coupled in series with the two stacked NMOS transistors. A first input of the NAND gate coincides with the gates of one of the two PMOS transistors and one of the two NMOS transistors. A second input of the NAND gate coincides with the gates of the other of the two PMOS transistor and the other of the two NMOS transistors. An output of the NAND gate corresponds to the node between the two parallel PMOS transistors and the two stacked NMOS transistors.

In the output latch 108 of FIG. 7, the first NAND gate 401 and the second NAND gate 402 (of FIG. 4) are realized as follows. The first NAND gate 401 includes: the transistor 721 in parallel with the transistor 711, and the first transistor 411 in series with the transistor 731. The second NAND gate 402 includes: the transistor 712 in parallel with the transistor 722, and the first transistor 412 in series with the transistor 732. The output of the first NAND gate 401 corresponds to the first output node 141, which provides the first output voltage 131 as the Out# value for the output latch 108. The output of the second NAND gate 402 corresponds to the second output node 142, which provides the second output voltage 132 as the Out value for the output latch 108.

The first output transition circuitry 241 (e.g., of FIG. 4) includes the first transistor 411 and the second transistor 421 coupled in series above the ground node. The second output transition circuitry 242 includes the first transistor 412 and the second transistor 422 coupled in series above the ground node. The output latch 108 also includes the transistor 701 and the transistor 702 to activate the output latch 108 during memory read times. The transistor 701 is coupled between the supply voltage rail ($V_{DD}$) and the first NAND gate 401 via the transistor 711. The transistor 702 is coupled between the supply voltage rail ($V_{DD}$) and the second NAND gate 402 via the transistor 702. The gates of the transistor 701 and the transistor 702 are coupled to the output-enable line 106 (not shown in FIG. 7) to receive the output-enable signal (OES).

To configure the output latch 108 of FIG. 7 to operate in accordance with the output latch 108 described above with reference to FIG. 4, the inputs and outputs are connected as follows. For the first NAND gate 401, the first input is coupled to the first storage line 101 to receive the data value Sa via the gates of the transistor 721 and the first transistor 411. The second input of the first NAND gate 401 is coupled to the output of the second NAND gate 402 at the second output node 142 via the gates of the transistor 711 and the transistor 731. The output of the first NAND gate 401 produces the first output voltage 131 at the first output node 141 as the data value Out#.

For the second NAND gate 402, the first input is coupled to the second storage line 102 to receive the data value Sa# via the gates of the transistor 722 and the first transistor 412. The second input of the second NAND gate 402 is coupled to the output of the first NAND gate 401 at the first output node 141 via the gates of the transistor 712 and the transistor 732. The output of the second NAND gate 402 produces the second output voltage 132 at the second output node 142 as the data value Out.

For the first output transition circuitry 241, the first transistor 411 is coupled to the first storage line 101 via the gate of the first transistor 411 so as to receive the data value Sa as a control signal. The second transistor 421 is coupled to the output-enable line 106 via the gate of the second transistor 421 to receive the output-enable signal (OES) as a control signal. For the second output transition circuitry 242, the first transistor 412 is coupled to the second storage line 102 via the gate of the first transistor 412 so as to receive the data value Sa# as a control signal. The second transistor 422 is coupled to the output-enable line 106 via the gate of the second transistor 422 to receive the output-enable signal as a control signal.

With the example circuit of FIG. 7 for a NAND gate-based output latch 108, two transistors are "reused" or serve dual purposes. In other words, two transistors are shared by two components that are shown as being logically separate in FIG. 4. The first NAND gate 401 and the first output transition circuitry 241 share the first transistor 411. The second NAND gate 402 and the second output transition circuitry 242 share the first transistor 412. Thus, logical components can share underlying physical circuit devices. For this example circuit, the area occupied by two NMOS transistors can be conserved for each output latch 108 that is deployed in an integrated circuit by sharing the two indicated transistors. For an example NOR gate-based implementation (e.g., of FIG. 5), a PMOS transistor can be shared between each NOR gate and a corresponding one of the first output transition circuitry 241 (e.g., the first transistor 511) and the second output transition circuitry 242 (e.g., the first transistor 512).

Figure 8:
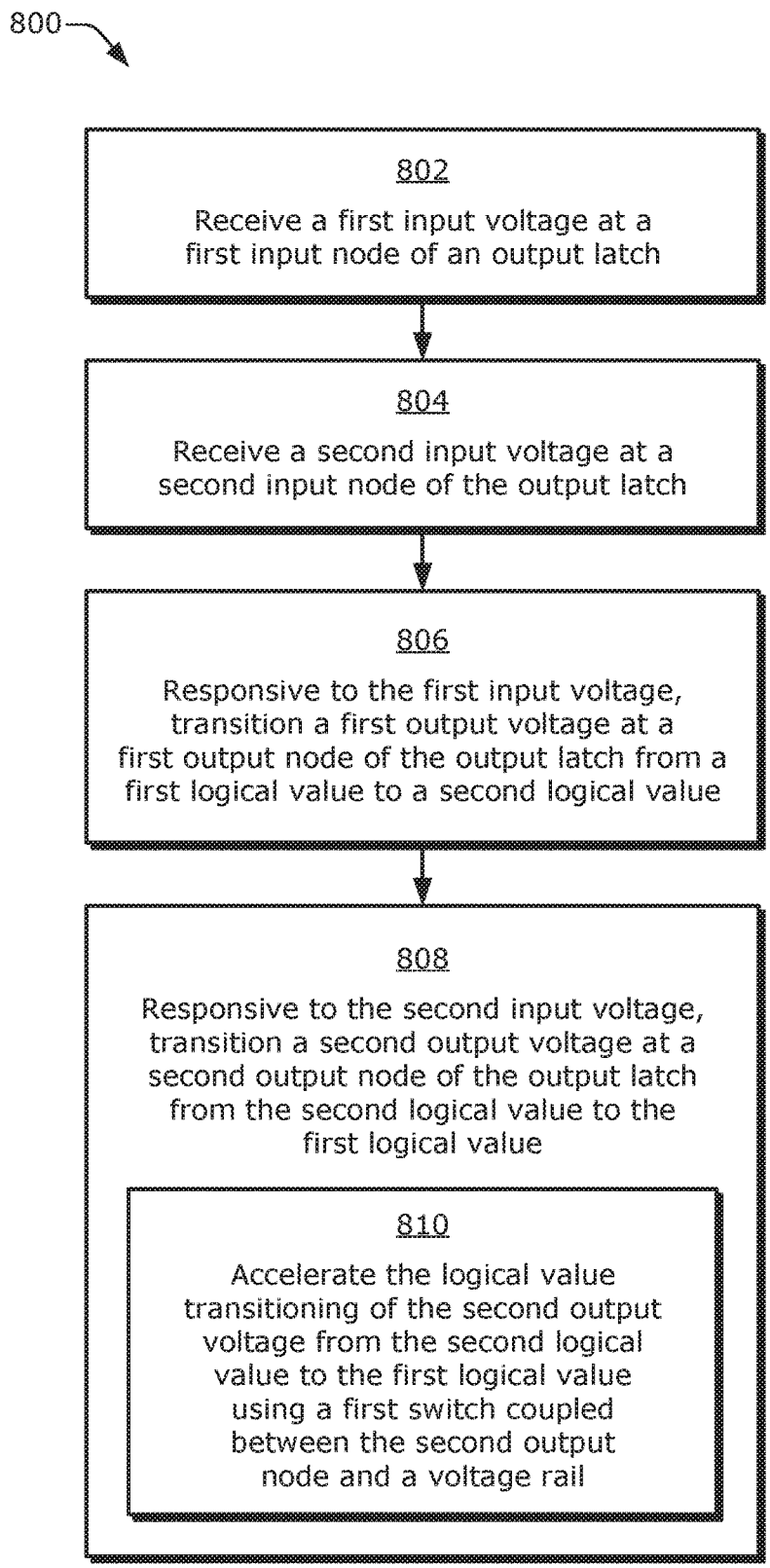
FIG. 8 is a flow diagram illustrating an example process for accelerating memory access with an output latch.

FIG. 8 is a flow diagram illustrating an example process 800 for accelerating memory access with an output latch. The process 800 is described in the form of a set of blocks 802-810 that specify operations that may be performed. However, operations are not necessarily limited to the order shown in FIG. 8 or described herein, for the operations may be implemented in alternative orders or in fully or partially overlapping manners. Operations represented by the illustrated blocks of the process 800 may be performed by an integrated circuit, such as an integrated circuit 910 of FIG. 9, which is described below. More specifically, the operations of the process 800 may be performed by an output latch 108 of FIGS. 1-5 and 7.

At block 802, a first input voltage is received at a first input node of an output latch. For example, an output latch 108 can receive a first input voltage 121 at a first input node 111 of the output latch 108. For instance, a first logic gate 301 of the output latch 108 may receive the first input voltage 121, which has a voltage level corresponding to a particular logical value, at a first input of the first logic gate 301.

At block 804, a second input voltage is received at a second input node of the output latch. For example, the output latch 108 can receive a second input voltage 122 at a second input node 112 of the output latch 108. A second logic gate 302 of the output latch 108 may receive the second input voltage 122, which has a voltage level corresponding to a complement of the particular logical value, at a second input of the second logic gate 302.

At block 806, responsive to the first input voltage, a first output voltage at a first output node of the output latch is transitioned from a first logical value to a second logical value. For example, responsive to the first input voltage 121, at least a data storage unit 208 can transition a first output voltage 131 at a first output node 141 of the output latch 108 from a first logical value to a second logical value. To transition the output voltage at the first output node 141, the first logic gate 301 may perform a logical operation based on two inputs, including the first input voltage 121, and produce an output that affects a voltage level of the first output voltage 131. The first logic gate 301 changes an output thereof between two different voltage levels to transition the first output voltage 131 from the first logical value to the second logical value (e.g., from 0-to-1 or from 1-to-0). Each logical value may correspond, for instance, to a low voltage level or a high voltage level.

At block 808, responsive to the second input voltage, a second output voltage at a second output node of the output latch is transitioned from the second logical value to the first logical value. For example, responsive to the second input voltage 122, at least the data storage unit 208 can transition a second output voltage 132 at a second output node 142 of the output latch 108 from the second logical value to the first logical value. To transition the output voltage at the second output node 142, the second logic gate 302 may perform a logical operation based on two inputs, including the second input voltage 122, and produce an output that affects a voltage level of the second output voltage 132. The second logic gate 302 changes an output thereof between two different voltage levels to transition the second output voltage 132 from the second logical value to the first logical value (e.g., from 1-to-0 or from 0-to-1). However, in this example scenario, the second logic gate 302 does not change an output thereof until the first logic gate 301 changes an output of the first logic gate 301. Consequently, the logical value transition at the second output node 142 is delayed as compared to the logical value transition at the first output node 141.

Accordingly, at block 810, the logical value transitioning of the second output voltage from the second logical value to the first logical value is accelerated using a first switch coupled between the second output node and a voltage rail. For example, second output transition circuitry 242 can accelerate the logical value transitioning of the second output voltage 132 from the second logical value to the first logical value using a first switch 312 coupled between the second output node 142 and a voltage rail 206. This acceleration of the logical value transitioning may be performed by placing the first switch 312 in an active state (e.g., closing the switch) based on the second input voltage 122 such that current flows and the second output voltage 132 at the second output node 142 is therefore pulled up or down towards a voltage level of the voltage rail 206. This acceleration effectively bypasses a sequential operation of a cross-coupling of the first logic gate 301 and the second logic gate 302.

Figure 9:
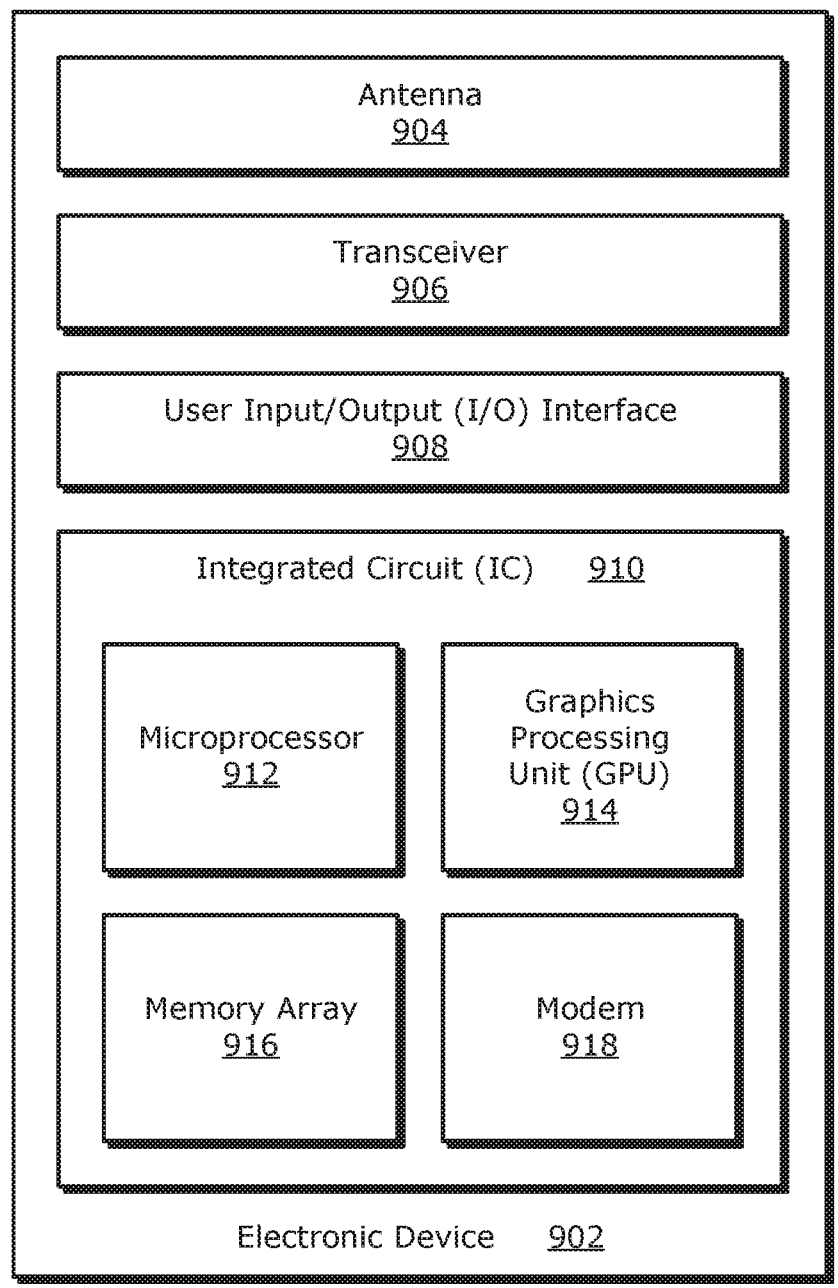
FIG. 9 depicts an example electronic device that includes an integrated circuit having a microprocessor and a memory array.

FIG. 9 depicts an example electronic device 902 that includes an integrated circuit (IC) 910 having a microprocessor 912 and a memory array 916. As shown, the electronic device 902 includes an antenna 904, a transceiver 906, and a user input/output (I/O) interface 908 in addition to the integrated circuit 910. Illustrated examples of the integrated circuit 910, or cores thereof, include the microprocessor 912, a graphics processing unit (GPU) 914, the memory array 916, and a modem 918. In one or more embodiments, the memory array 916, a cache memory of the microprocessor 912, or a cache memory of the GPU 914 can be accessed using an implementation of the output latch 108 as described herein.

The electronic device 902 may be a mobile or battery-powered device or a fixed device that is designed to be powered by an electrical grid. Examples of the electronic device 902 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 902 may also be a device, or a portion thereof, having embedded electronics. Examples of the electronic device 902 with embedded electronics include a passenger vehicle, industrial equipment, a refrigerator or other home appliance, a drone or other unmanned aerial vehicle (UAV), or a power tool.

For a device with a wireless capability, the electronic device 902 includes an antenna 904 that is coupled to a transceiver 906 to enable reception or transmission of one or more wireless signals. The integrated circuit 910 may be coupled to the transceiver 906 to enable the integrated circuit 910 to have access to received wireless signals or to provide wireless signals for transmission via the antenna 904. The electronic device 902 as shown also includes at least one user I/O interface 908. Examples of the user I/O interface 908 include a keyboard, a mouse, a microphone, a touch-sensitive screen, a camera, an accelerometer, a haptic mechanism, a speaker, a display screen, or a projector.

The integrated circuit 910 may comprise, for example, one or more instances of a microprocessor 912, a GPU 914, a memory array 916, a modem 918, and so forth. The microprocessor 912 may function as a central processing unit (CPU) or other general-purpose processor. Some microprocessors include different parts, such as multiple processing cores, that may be individually powered on or off. The GPU 914 may be especially adapted to process visual-related data for display. If visual-related data is not being rendered or otherwise processed, the GPU 914 may be fully or partially powered down. The memory array 916 stores data for the microprocessor 912 or the GPU 914. Example types of memory for the memory array 916 include random access memory (RAM), such as dynamic RAM (DRAM) or static RAM (SRAM); flash memory; and so forth. If programs are not accessing data stored in memory, the memory array 916 may be powered down overall or block-by-block. The modem 918 demodulates a signal to extract encoded information or modulates a signal to encode information into the signal. If there is no information to decode from inbound communications or encode for outbound communications, the modem 918 may be idled to reduce power consumption. The integrated circuit 910 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 910 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 910 generally, may be termed blocks or cores. A core or circuit block of an SOC may be powered down if not in use. Examples of cores or circuit blocks include, in addition to those that are illustrated in FIG. 9, a voltage regulator, a core memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a processing or GPU circuit block, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
an output latch including:
a data storage unit comprising:
a first input node configured to receive a first input voltage;
a second input node configured to receive a second input voltage;
a first output node configured to provide a first output voltage; and
a second output node configured to provide a second output voltage;
first output transition circuitry coupled to the first output node and including a first control node coupled to the first input node, the first output transition circuitry configured to accelerate a voltage level transition of the first output voltage responsive to the first input voltage; and
second output transition circuitry coupled to the second output node and including a first control node coupled to the second input node, the second output transition circuitry configured to accelerate a voltage level transition of the second output voltage responsive to the second input voltage.

2. The integrated circuit of claim 1, wherein:
the first input voltage and the second input voltage comprise complementary data values; and
the data storage unit is configured to store the complementary data values.

3. The integrated circuit of claim 2, wherein the data storage unit comprises an S-R latch.

4. The integrated circuit of claim 3, wherein the S-R latch comprises:
a first NAND gate coupled between the first input node and the first output node; and
a second NAND gate coupled between the second input node and the second output node,
wherein the first NAND gate and the second NAND gate are cross-coupled to one another.

5. The integrated circuit of claim 4, wherein:
the first NAND gate and the first output transition circuitry are configured to share a transistor; and
the second NAND gate and the second output transition circuitry are configured to share another transistor.

6. The integrated circuit of claim 3, wherein the S-R latch comprises:
a first NOR gate coupled between the first input node and the first output node; and
a second NOR gate coupled between the second input node and the second output node,
wherein the first NOR gate and the second NOR gate are cross-coupled to one another.

7. The integrated circuit of claim 1, wherein:
the data storage unit is coupled to an output-enable line configured to receive an output-enable signal;
the first output transition circuitry includes a second control node coupled to the output-enable line; and the second output transition circuitry includes a second control node coupled to the output-enable line.

8. The integrated circuit of claim 7, wherein:
the first output transition circuitry is configured to be in an active mode or an inactive mode based on a value of the output-enable signal; and
the second output transition circuitry is configured to be in the active mode or the inactive mode based on the value of the output-enable signal.

9. The integrated circuit of claim 8, wherein:
the first output transition circuitry comprises two switches coupled in series between the first output node and a voltage rail; and
the second output transition circuitry comprises two switches coupled in series between the second output node and the voltage rail.

10. The integrated circuit of claim 9, wherein the two switches of the first output transition circuitry comprise:
a first transistor having a gate corresponding to the first control node of the first output transition circuitry, the first transistor configured to be turned on responsive to the first input voltage; and
a second transistor having a gate corresponding to the second control node of the first output transition circuitry, the second transistor configured to be turned on responsive to the output-enable signal.

11. The integrated circuit of claim 1, further comprising:
a memory element coupled to the first input node and the second input node and configured to provide a data value responsive to an output-enable signal.

12. The integrated circuit of claim 11, further comprising:
a sense amplifier coupled between the memory element and the output latch, the sense amplifier configured to read the data value from the memory element responsive to the output-enable signal and to provide the data value to the output latch via the first input node and the second input node.

13. An integrated circuit comprising:
an output latch including:
a data storage unit configured to store complementary data values, the data storage unit comprising:
a first input node configured to receive a first input voltage;
a second input node configured to receive a second input voltage;
a first output node configured to provide a first output voltage; and
a second output node configured to provide a second output voltage;
first means for accelerating a voltage level transition of the first output voltage at the first output node responsive to the first input voltage; and
second means for accelerating a voltage level transition of the second output voltage at the second output node responsive to the second input voltage.

14. The integrated circuit of claim 13, wherein:
the first means for accelerating the voltage level transition comprises a first means for accelerating a falling voltage level transition of the first output voltage at the first output node responsive to the first input voltage; and
the second means for accelerating the voltage level transition comprises a second means for accelerating a falling voltage level transition of the second output voltage at the second output node responsive to the second input voltage.

15. The integrated circuit of claim 14, wherein the second means for accelerating the falling voltage level transition comprises a first switching means for enabling current to flow if the second output voltage is to transition from a high voltage level to a low voltage level.

16. The integrated circuit of claim 14, wherein the second means for accelerating the falling voltage level transition comprises a first switching means for pulling down a voltage level of the second output voltage at the second output node responsive to a voltage level of the second input voltage.

17. The integrated circuit of claim 14, wherein:
the first means for accelerating the falling voltage level transition of the first output voltage at the first output node is further responsive to an output-enable signal; and
the second means for accelerating the falling voltage level transition of the second output voltage at the second output node is further responsive to the output-enable signal.

18. The integrated circuit of claim 17, further comprising:
a static random access memory (SRAM) cell coupled to the output latch,
wherein the output latch is configured to enable read access to the SRAM cell responsive to the output-enable signal.

19. The integrated circuit of claim 13, wherein:
the first means for accelerating the voltage level transition comprises a first means for accelerating a rising voltage level transition of the first output voltage at the first output node responsive to the first input voltage; and
the second means for accelerating the voltage level transition comprises a second means for accelerating a rising voltage level transition of the second output voltage at the second output node responsive to the second input voltage.

20. The integrated circuit of claim 13, wherein the data storage unit comprises:
a first logic gate having a first input, a second input, and an output, with the first input coupled to the first input node, the second input coupled to the second output node, and the output coupled to the first output node; and
a second logic gate having a first input, a second input, and an output, with the first input coupled to the first output node, the second input coupled to the second input node, and the output coupled to the second output node.

21. A method for accelerating memory access with an output latch, the method comprising:
receiving a first input voltage at a first input node of the output latch;
receiving a second input voltage at a second input node of the output latch;
responsive to the first input voltage, transitioning a first output voltage at a first output node of the output latch from a first logical value to a second logical value; and
responsive to the second input voltage, transitioning a second output voltage at a second output node of the output latch from the second logical value to the first logical value, including accelerating the logical value transitioning of the second output voltage from the second logical value to the first logical value using a first switch coupled between the second output node and a voltage rail.

22. The method of claim 21, wherein the accelerating comprises placing the first switch in an active state based on the second input voltage.

23. The method of claim 21, wherein the accelerating comprises bypassing a sequential operation of a pair of cross-coupled logic gates.

24. The method of claim 21, wherein the transitioning of the second output voltage at the second output node from the second logical value to the first logical value includes accelerating the logical value transitioning of the second output voltage from the second logical value to the first logical value using a second switch that is responsive to an output-enable signal for a memory element coupled to the output latch.

25. The method of claim 24, wherein:
the first logical value comprises a low voltage level;
the second logical value comprise a high voltage level; and
the accelerating the logical value transitioning of the second output voltage from the second logical value to the first logical value comprises accelerating a falling voltage level transition of the second output voltage from the high voltage level to the low voltage level.

26. The method of claim 21, further comprising:
propagating voltage levels of the first input voltage at the first input node and voltage levels of the second input voltage at the second input node to the first output voltage at the first output node and the second output voltage at the second output node using an S-R latch.

27. An integrated circuit comprising:
a memory element having a first storage line and a second storage line; and
an output latch coupled to the memory element and including a first output node and a second output node, the output latch including:
a first NAND gate having a first input, a second input, and an output, with the first input coupled to the first storage line, the second input coupled to the second output node, and the output coupled to the first output node;
a second NAND gate having a first input, a second input, and an output, with the first input coupled to the first output node, the second input coupled to the second storage line, and the output coupled to the second output node;
first output transition circuitry coupled between the first output node and a ground node, the first output transition circuitry including a first control node coupled to the first storage line; and
second output transition circuitry coupled between the second output node and the ground node, the second output transition circuitry including a first control node coupled to the second storage line.

28. The integrated circuit of claim 27, wherein:
the memory element is coupled to an output-enable line; and
the first output transition circuitry comprises:
a first transistor coupled to the first output node of the output latch, the first transistor including a gate that corresponds to the first control node of the first output transition circuitry; and
a second transistor coupled between the first transistor and the ground node, the second transistor including a gate coupled to the output-enable line.

29. The integrated circuit of claim 28, wherein the first NAND gate and the first output transition circuitry are configured to share the first transistor.

30. The integrated circuit of claim 27, wherein the second output transition circuitry is configured to initiate a falling voltage level transition at the second output node of the output latch responsive to a voltage level on the second storage line before the second NAND gate can initiate the falling voltage level transition responsive to the voltage level on the second storage line.

* * * * *